(12) United States Patent
Barry

(10) Patent No.: US 9,202,550 B2
(45) Date of Patent: Dec. 1, 2015

(54) APPATUSES AND METHODS FOR PRECHARGE OPERATIONS AND ACCUMULATED CHARGE DISSIPATION

(75) Inventor: Beau D. Barry, Boise, ID (US)

(73) Assignee: Micron Technology, Inc., Boise, ID (US)

(*) Notice: Subject to any disclaimer, the term of this patent is extended or adjusted under 35 U.S.C. 154(b) by 222 days.

(21) Appl. No.: 13/560,181

(22) Filed: Jul. 27, 2012

(65) Prior Publication Data

US 2014/0029365 A1   Jan. 30, 2014

(51) Int. Cl.

| | |
|---|---|
| *G11C 7/00* | (2006.01) |
| *G11C 11/4076* | (2006.01) |
| *G11C 7/12* | (2006.01) |
| *G11C 11/4094* | (2006.01) |
| *H01L 27/108* | (2006.01) |

(52) U.S. Cl.
CPC .............. *G11C 11/4076* (2013.01); *G11C 7/12* (2013.01); *G11C 11/4094* (2013.01); *H01L 27/10876* (2013.01); *H01L 27/10882* (2013.01); *H01L 27/10885* (2013.01); *H01L 27/10891* (2013.01)

(58) Field of Classification Search
CPC .. G11C 11/4097; G11C 11/4094; G11C 7/18; G11C 11/4076; G11C 7/12; H01L 27/10876; H01L 27/10882; H01L 27/10891; H01L 27/10885

USPC .................................................. 365/202, 203
See application file for complete search history.

(56) References Cited

U.S. PATENT DOCUMENTS

| | | | |
|---|---|---|---|
| 5,822,264 A | 10/1998 | Tomishima et al. | |
| 5,903,502 A | 5/1999 | Porter | |
| 6,081,443 A | 6/2000 | Morishita et al. | |
| 7,038,958 B2 | 5/2006 | Joo et al. | |
| 7,872,933 B2 | 1/2011 | Ohsawa | |
| 2007/0177443 A1 | 8/2007 | Ohsawa | |
| 2008/0232182 A1* | 9/2008 | Lee et al. | 365/203 |
| 2009/0109775 A1* | 4/2009 | Hwang | 365/203 |
| 2015/0049565 A1 | 2/2015 | Xia et al. | |

* cited by examiner

*Primary Examiner* — Richard Elms
*Assistant Examiner* — Mohammed A Bashar
(74) *Attorney, Agent, or Firm* — Dorsey & Whitney LLP

(57) ABSTRACT

Examples described include precharge operations and circuitry for performing precharge operations. Digit lines may be driven to ground during a portion of example precharge operations. By driving the digit lines to ground, charge accumulating in bodies of vertical access devices may be discharged to the digit lines in some examples. To drive the digit lines to ground, a dynamic reference may be used where the reference is ground during one portion of the precharge operation and another value, which may be between two supply voltages (e.g. $V_{CC}/2$), during another portion of the precharge operation.

19 Claims, 7 Drawing Sheets

APPATUSES AND METHODS FOR PRECHARGE OPERATIONS AND ACCUMULATED CHARGE DISSIPATION

TECHNICAL FIELD

Examples described herein relate generally to semiconductor memory, and examples of systems and methods for discharging trapped charge from a vertical access device are described.

BACKGROUND

Processor-based systems use memory devices, such as dynamic random access memory ("DRAM") devices, to store data (e.g. representing instructions, data to be processed, etc.) that are accessed by the processor. In a typical computer system, the processor communicates with the system memory including the memory devices through a processor bus and one or more memory controllers. In some memory systems, a group of memory devices of the system memory are controlled by an associated memory controller. The processor may provide to the memory controller a memory request including a memory command, such as a read command, and an address designating the location from which data are to be read from memory. The memory controller may use the command and address to generate appropriate memory commands as well as row and column addresses, which may be provided to the memory devices associated with that memory controller. In response to the commands and addresses, data may be transferred between the memory devices and the processor.

A DRAM cell may generally include an access device (e.g. a transistor) and a capacitor for storing charge in the memory cell. Word lines may be connected to groups of memory cells (e.g. rows of memory cells) while digit lines may be connected to other groups of memory cells (e.g. columns of memory cells) such that one memory cell may be addressed by a word and digit line. A signal provided by a word line may activate the access device (e.g. transistors) of the corresponding group of memory cells, for example the word line may be coupled to the gates of access devices. The digit lines may be coupled to the sources or drains of access devices, and may accordingly be driven to a logic high or low voltage (e.g. $V_{cc}$ or ground) depending on the charge of the memory cell. Sense amplifiers may be used to drive the digit lines. Typically, a pair of digit lines are used for each group (e.g. column) of memory cells. The pair of digit lines may carry complementary signals, and may be precharged to a reference voltage which may be between the logic high and low voltages used to indicate a '1' and '0'. Once activated, by a word line control signal, a sense amplifier may then drive the digit lines to respective voltages (e.g. $V_{cc}$ and ground) depending on the value stored in the memory cell.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Figure 1:
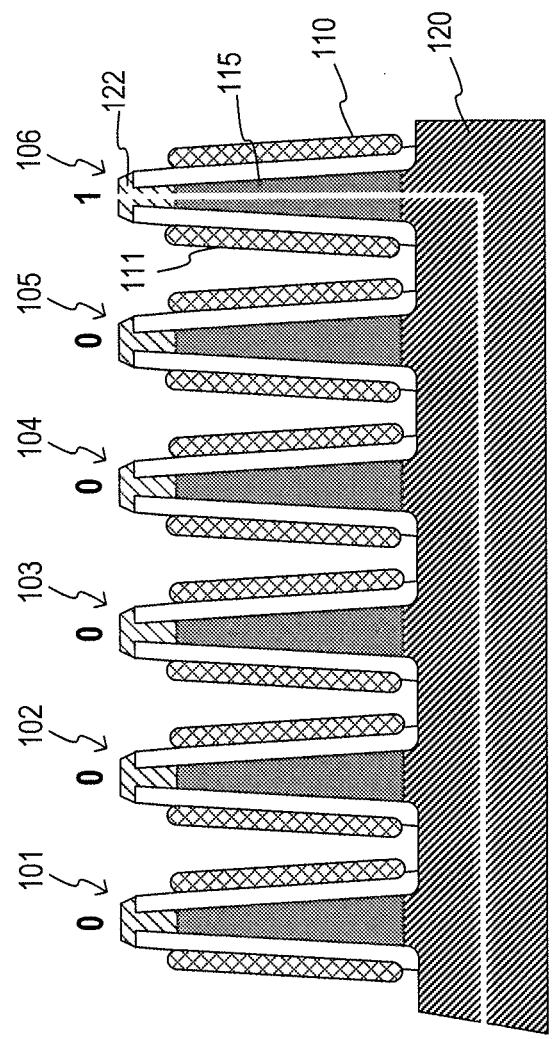
FIG. 1 is a schematic illustration of a cross-sectional view of multiple vertical access devices along a digit line in a memory.

FIG. 1 is a schematic illustration of a cross-sectional view of multiple vertical access devices along a digit line in a memory. The memory 100 includes devices 101-106 (e.g. vertical access devices). The devices 101-106 may include transistors, for example. Any number of devices may be used in memories in accordance with embodiments of the present invention. Using the device 106 as an example, a word line may be implemented by gates 110, 111. In the vertical device 106 shown in FIG. 1, the gates 110, 111 may be implemented as rows of material extending in and out of the page. A body 115 of the device 106 may be implemented as a silicon pillar. The device 106 may be considered to have a source or drain at the top of the body 115 and a source or drain at the bottom of the body 115, connected to a digit line 120.

The digit line 120 may be implemented as a doped silicon region beneath the devices 101-106. A memory capacitor may be in contact with the source or drain contact of the body 115 at region 122. In this manner, a stored state of the cell may be read from the region 122 to the digit line 120 through the body 115. During operation, for example, activating a word line (e.g. gates 110 and 111) may turn on the device 106. A sense amplifier (not shown in FIG. 1) may drive the digit line 120 to a logical '1' or '0' (e.g. $V_{cc}$ or ground) based on the state of the memory cell connected to the device 106. In the example shown in FIG. 1, the cell connected to the device 106 stores a logical '1'. Accordingly, the digit line 120 may be driven to $V_{cc}$.

Note, in FIG. 1, other devices 101-105 are connected to cells storing logical '0'. Accordingly, when the digit line 120 is driven to a logical '1' (e.g. $V_{cc}$) and remains at the logical '1' level, a p-n junction between the bodies and the digit line may be reversed biased, and positively-charged holes may accumulate in the bodies of the devices 101-105. As more holes accumulate, the voltage of the bodies may become increasingly positive, which may forward bias the junction between one or more of the bodies and the connected capacitors, possibly causing charge to be pumped into the capacitor and undesirably changing, for example, a stored 0 to a stored 1.

Embodiments of the present invention accordingly provide systems and methods for discharging one or more bodies of devices, such as vertical access devices, during a precharge portion of memory operation. Embodiments of the present invention provide for digit lines to be grounded for a period of time during a precharge operation to allow discharge of any accumulated charge from bodies of vertical access devices. As will be described further below, the period of time may be adjustable.

Figure 2:
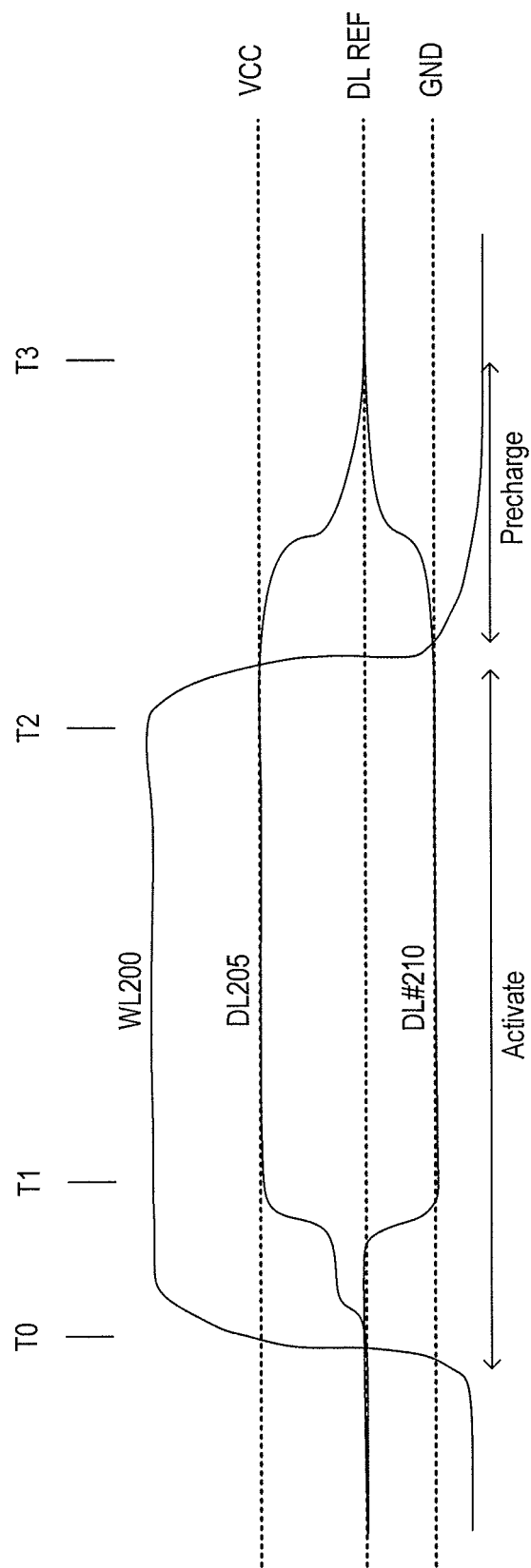
FIG. 2 is a timing diagram illustrating voltage levels of a word line and digit lines during typical DRAM activate and precharge operations.

FIG. 2 is a timing diagram illustrating voltage levels of a word line and digit lines during typical DRAM activate and precharge operations. At time $t_0$, a word line 200, which may be implemented using the word line 110, 111 of FIG. 1, may be activated, reaching a voltage $V_{cc}$ or higher. Accordingly, complementary digit lines will begin to be driven toward values based on the logic state of the memory cell to which the word line 200 is connected. By time $t_1$, complementary digit lines 205, 210 have attained voltages corresponding to a logic 1 and 0, respectively (e.g. $V_{cc}$ and ground), indicating a particular logic level stored in the associated memory cell. The digit line 205 may be implemented, for example, using the digit line 120 if FIG. 1. At time $t_2$ the word line 200 may be deactivated. Accordingly, by time $t_3$ the complementary digit lines 205 and 210 have returned to a reference voltage (DL_REF in FIG. 2) between the voltages representing logic 1 and 0. For example, $V_{cc}/2$ may be used as the reference voltage.

Figure 3:
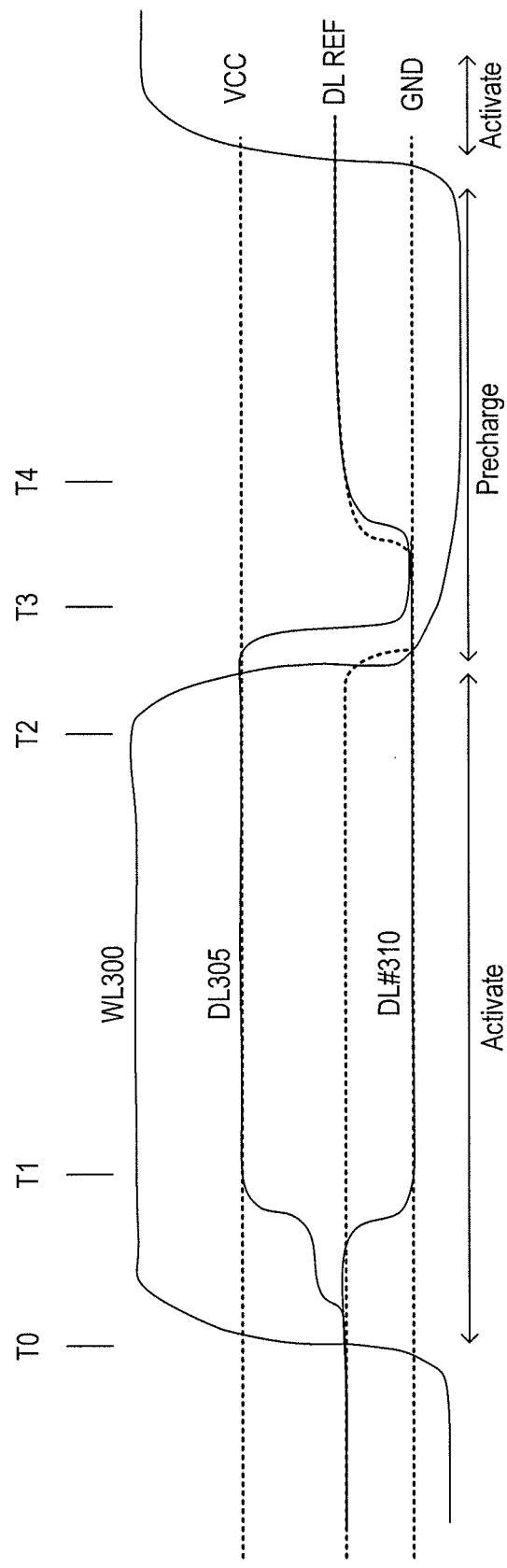
FIG. 3 is a timing diagram illustrating voltage levels of a word line and digit lines during DRAM activate and precharge operations in accordance with an example of the present invention.

FIG. 3 is a timing diagram illustrating voltage levels of a word line and digit lines during DRAM activate and precharge operations in accordance with an example of the present invention. At time $t_0$, a word line 300, which may be implemented using the word line 110, 111 of FIG. 1, may be activated, reaching a voltage $V_{cc}$ or higher. The word line 300 may be activated, for example, responsive to receipt of an activate command provided by memory control circuitry. Accordingly, complementary digit lines will begin to be driven toward values based on the logic state of the memory cell to which the word line 300 is connected. By time $t_1$, complementary digit lines 305, 310 have attained voltages corresponding to a logic 1 and 0, respectively (e.g. $V_{cc}$ and ground), indicating a particular logic level stored in the associated memory cell. The digit line 305 may be implemented, for example, using the digit line 120 if FIG. 1. At time $t_2$ the word line 300 may be deactivated. The word line 300 may be deactivated, for example, responsive to a change in state of the activate command or receipt of a precharge command provided by memory control circuitry. However, in contrast to the timing diagram of FIG. 2, in FIG. 3, following deactivation of the word line 300, the digit lines 305 and 310 may be driven to ground prior to precharging to DL REF. For example, the digit lines 305 and 310 may be held at ground from time $t_3$ to $t_4$, before returning to a DL REF voltage. The time period between $t_3$ and $t_4$, which may be adjustable in embodiments of the present invention, allows discharging of stored charge from vertical access device bodies. In some examples, the digit lines may be driven to ground during each precharge operation. In some examples, the digit lines may be driven to ground during a precharge operation following only activation operations that charged a digit line to a logic '1' (e.g. $V_{cc}$). In some examples, driving the digit lines to ground may not be performed following activation operations for reading a logic '0' (e.g. after the digit line is driven to a low voltage, e.g. ground).

Driving the digit lines to ground following an activate operation may ensure charge trapped in a body of a vertical access device may be minimized, which may avoid or reduce charge accumulation in the body. For example, the p-n junction on the digit line side of the device may turn on after the digit line is driven to ground, flushing the body of positive charge. This may avoid, for example, too much charge accumulation in the body of a vertical access device connected to a cell storing a '0' data state. Too much accumulated charge may cause a p-n junction on the cell side of the device to turn on, adding positive charge to the cell capacitor and reducing the strength of the stored '0' data state, potentially causing it to read instead as a '1'.

Figure 4:
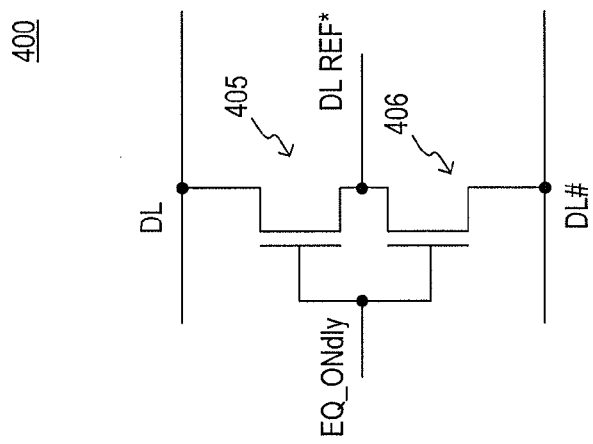
FIG. 4 is a schematic illustration of a precharge circuit in accordance with an embodiment of the present invention.

Embodiments of circuits will now be described that may be used to implement precharge procedures described herein, such as those described above with reference to FIG. 3. FIG. 4 is a schematic illustration of a precharge circuit in accordance with an embodiment of the present invention. The precharge circuit 400 is configured to couple digit lines DL and DL# to a reference DL_REF* during a precharge routine. The precharge circuit 400 is provided with a signal EQ_ONdly, which may be a delayed version of a precharge command sent from memory control circuitry, as will be described further below. The precharge circuit 400 includes transistors 405 and 406, each having one source/drain coupled to DL or DL#, respectively, and one source/drain coupled to DL_REF*. The transistors 405 and 406 may be provided the EQ_ONdly signal at their gates. Responsive to the EQ_ONdly signal, accordingly, the transistors 405 and 406 may turn on, coupling the digit lines DL and DL# to the reference DL_REF*. In embodiments of the present invention, the reference DL_REF* may change during the precharge procedure such that the reference DL_REF* may be equal to ground for a period of time and may be equal to another voltage, such as a voltage between ground and a supply (e.g. $V_{CC}/2$), during a remaining portion of the precharge routine. In this manner, during the time DL and DL# are coupled to DL_REF*, the digit lines may be held at ground for an adjustable period of time and may then be held at another voltage (e.g. DVC2) for the remaining period of time of the precharge routine.

Figure 5:
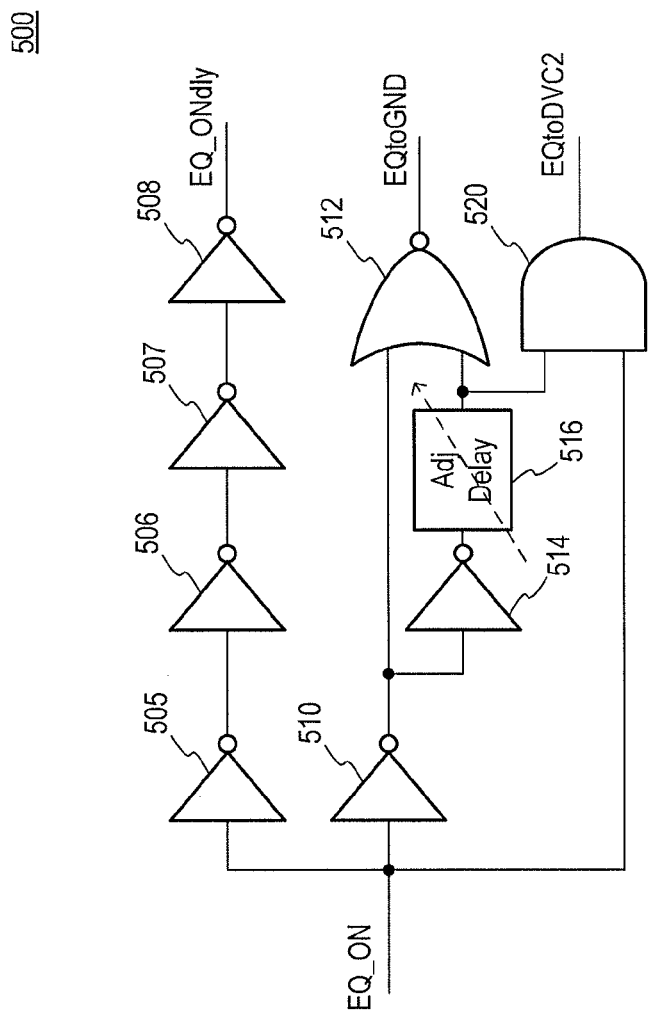
FIG. 5 is a schematic illustration of a precharge control signal circuit in accordance with an embodiment of the present invention.

FIG. 5 is a schematic illustration of a precharge control signal circuit in accordance with an embodiment of the present invention. The precharge control signal circuit 500 may receive a precharge control signal, e.g. EQ_ON, from memory control circuitry. The circuit 500 may utilize the precharge control signal to generate intermediate control signals (e.g. EQ_ONdly, EQtoGND, and EQtoDVC2) used to implement precharge routines in accordance with embodiments of the present invention. Inverting delay elements 505-508 are coupled in series between an input and a first output of the circuit 500. While four delay elements are shown in FIG. 5, any number or type of delay elements may be used in other examples. The precharge command, e.g. EQ_ON, may be provided to the first delay element 505, and coupled through the series of delay elements 505-508 to provide a delayed precharge signal, e.g. EQ_ONdly. As described above, the delayed precharge signal may be provided to the precharge circuit 400 of FIG. 4.

Referring again to FIG. 5, the precharge control signal circuit 500 may also provide a control signal (e.g. EQtoGND) causing a reference, e.g. DL-REF*, to be set to ground and a control signal (e.g. EQtoDVC2) causing the reference, e.g. DL REF*, to be set to another voltage (e.g. $V_{CC}/2$). An inverting delay element 510 may be provided the precharge command (e.g. EQ_ON), and provide a delayed version of the precharge command to a first input of NOR gate 512. Accordingly, in embodiments where the precharge signal EQ_ON is active high, the NOR gate 512 may receive a delayed low signal responsive to receipt of the precharge command by the inverting delay element 510. There may accordingly be two low inputs to the NOR gate 512, resulting in an active high EQtoGND signal. Another inverting delay element 514 and an adjustable delay 516 may be coupled in series between the inverting delay element 510 and a second input of the NOR gate 512. Responsive to receipt of an active high EQ_ON signal, the inverting delay element 510 may provide a low signal to the inverting delay element 514, which may in turn provide a high signal to the adjustable delay 516. The adjustable delay 516 may provide a further delayed high signal to the second input of the NOR gate 512. Accordingly, the output of the NOR gate 512 may transition from high, as described above, to low, responsive to receipt of the delayed high signal from the adjustable delay 516. In this manner, the EQtoGND signal may remain high for an adjustable period of time that may be determined in part by the amount of delay provided by the adjustable delay 516.

Moreover, an AND gate 520 may receive the precharge command (e.g. EQ_ON) at a first input and an output of the adjustable delay 516 at a second input. Accordingly, when both the EQ_ON signal and the output of the adjustable delay 516 are high, the signal EQtoDVC2 may transition high. In this manner, a control signal for setting DL REF to ground (e.g. EQtoGND) may be active from a first delayed time after the precharge command (e.g. EQ_ON) is active through a time determined by an adjustable delay element. Another control signal for setting DL REF to another voltage (e.g. a voltage between supply voltages such as $V_{cc}/2$), may be active after the control signal for setting DL REF to ground has become inactive.

Figure 6:
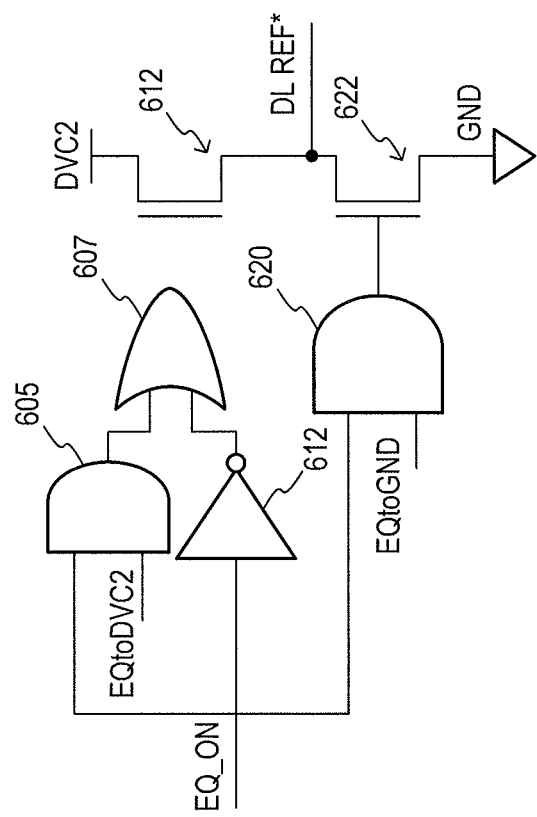
FIG. 6 is a schematic illustration of a supply driver circuit for a reference in accordance with an embodiment of the present invention.

FIG. 6 is a schematic illustration of a supply driver circuit for a reference in accordance with an embodiment of the present invention. The circuit 600 may receive a precharge command (e.g. EQ_ON) from memory control circuitry and may provide a reference (e.g. DL REF*) that may be provided, for example, to the precharge circuit of FIG. 4. The circuit 600 includes an AND gate 605 that may receive the precharge command (e.g. EQ_ON) at a first input and a control signal (e.g. EQtoDVC2) at a second input. The output of the AND gate 605 is accordingly high when both the precharge command and the control signal are high. The output of the AND gate 605 may be coupled to a first input of OR gate 607. A second input of the OR gate 607 may receive an inverted delayed version of the precharge command (e.g. EQ_ON) through an inverting delay element 610. Accordingly, an output of the OR gate 607 may be high when either the output of the AND gate 605 or the output of the inverting delay element 610 is high—e.g. during a precharge operation when the control signal indicative of providing a reference between supply voltages is active or when a precharge operation is not occurring. The output of the OR gate 607 may be coupled to a gate of transistor 612. The transistor 612 may have a first source/drain coupled to a voltage between supply voltages (e.g. DVC2 which may have a value of $V_{cc}/2$). Accordingly, when the output of the OR gate 607 is high, the transistor 612 may turn on, causing DL REF* to equal DVC2.

The circuit 600 also includes AND gate 620. The AND gate 620 may receive the precharge command (e.g. EQ_ON) at a first input and a control signal indicative of providing a reference of ground (e.g. EQtoGND) at a second input. In this manner, an output of the AND gate 620 may be high when both the precharge command and the EQtoGND signal are active. The output of the AND gate 620 may be coupled to a gate of a transistor 622. The transistor 622 may have one source/drain coupled to the reference (e.g. DL REF*) and another source/drain coupled to ground. When the output of the AND gate 620 is high, the transistor 622 may turn on, setting the reference (e.g. DL REF*) equal to ground. Operation of the circuit 600 may accordingly result in providing a reference (e.g. DL REF*) equal to one voltage (e.g. DVC2) when the signal EQtoDVC2 is high during a precharge operation and the reference (e.g. DL REF*) equal to another voltage (e.g. ground) when the signal EQtoGND is high during the precharge operation. As described above, the reference may be provided to the circuit 400 to drive word lines to the reference.

Figure 7:
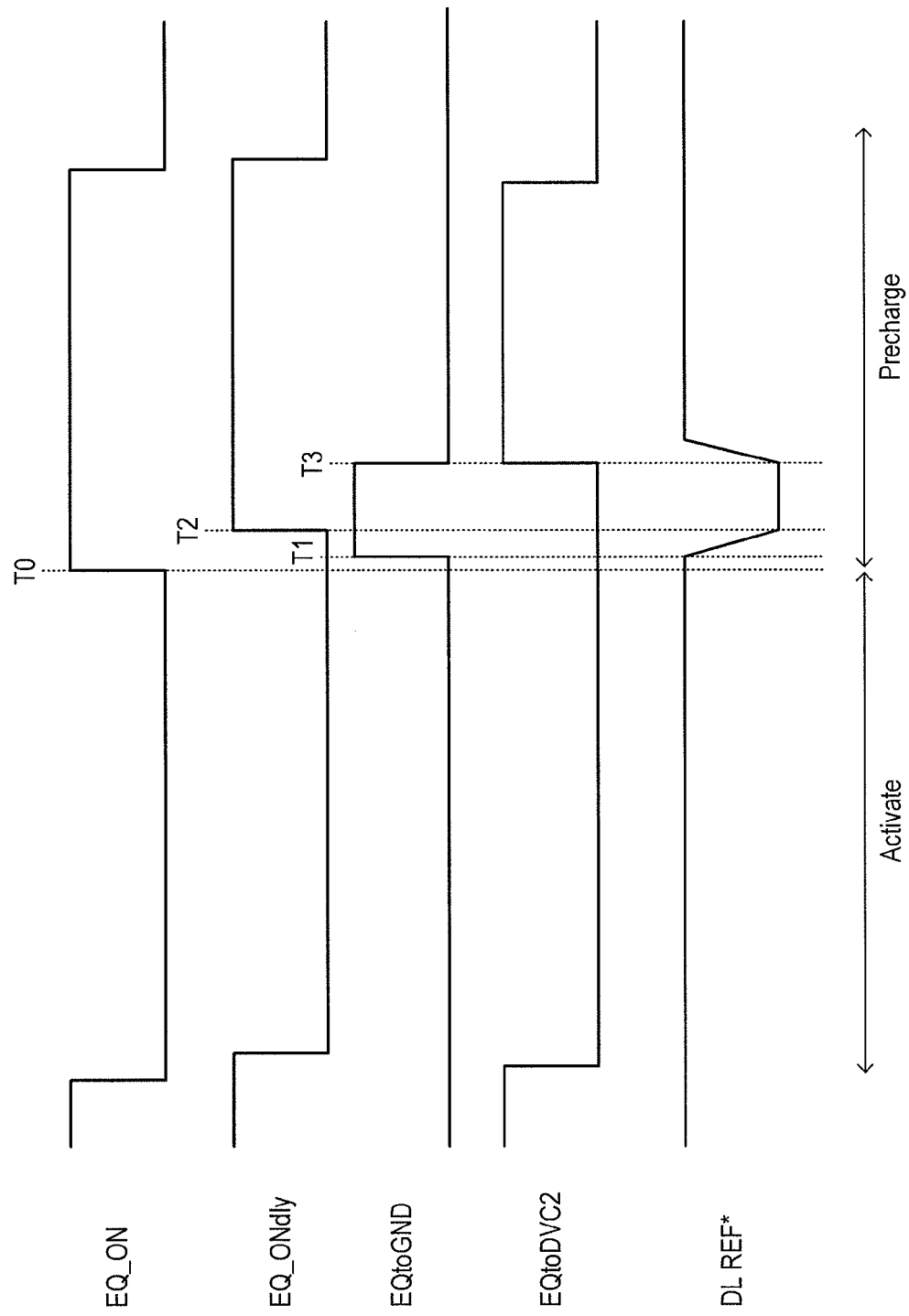
FIG. 7 is a timing diagram illustrating example timing of control signals which may be provided by the circuits of FIGS. 4-6 in accordance with embodiments of the present invention.

FIG. 7 is a timing diagram illustrating example timing of control signals which may be provided by the circuits of FIGS. 4-6 in accordance with embodiments of the present invention. FIG. 7 illustrates signals EQ_ON, EQ_ONdly, EQtoGND, EQtoDVC2, and a value of reference DL REF* during example activate and precharge procedures. For brevity, the signals during the precharge procedures will be described in further detail herein. As described above, a precharge command (e.g. EQ_ON) may be received to initiate a precharge procedure. The EQ_ON signal accordingly transitions high (e.g. active) at a time $t_0$. At time $t_1$, the EQtoGND signal may transition high (e.g. by operation of the circuit 500 of FIG. 5). Accordingly, the reference DL REF* may begin to transition to a low (e.g. ground) value at time $t_1$. At time $t_2$, the EQ_ONdly signal may transition high (e.g. by operation of the circuit 500 of FIG. 5). The amount of delay provided by the delay elements 505-508 of FIG. 5 may be selected such that the signal EQ_ONdly transitions high at a time $t_2$ which is on or after the reference has transitioned to ground. In this manner, a stable reference may be provided by the circuit 600 of FIG. 6 to the circuit 400 of FIG. 4 by time $t_2$.

Referring again to FIG. 7, the EQtoGND signal may remain high through a time $t_3$. The amount of time the EQtoGND signal remains high (e.g. between $t_1$ and $t_3$) may be determined in part by the delay provided by the adjustable delay 516 of FIG. 5. At time $t_3$ when the EQtoGND signal transitions low, the EQtoDVC2 signal may transition high (e.g. by operation of the circuit 500 of FIG. 5), and DL REF* begins to transition to a second value, generally a value between supply voltages (e.g. $V_{CC}/2$). In this manner, a length of time that DL REF* remains at ground may be set in part by a delay provided by an adjustable delay element.

Figure 8:
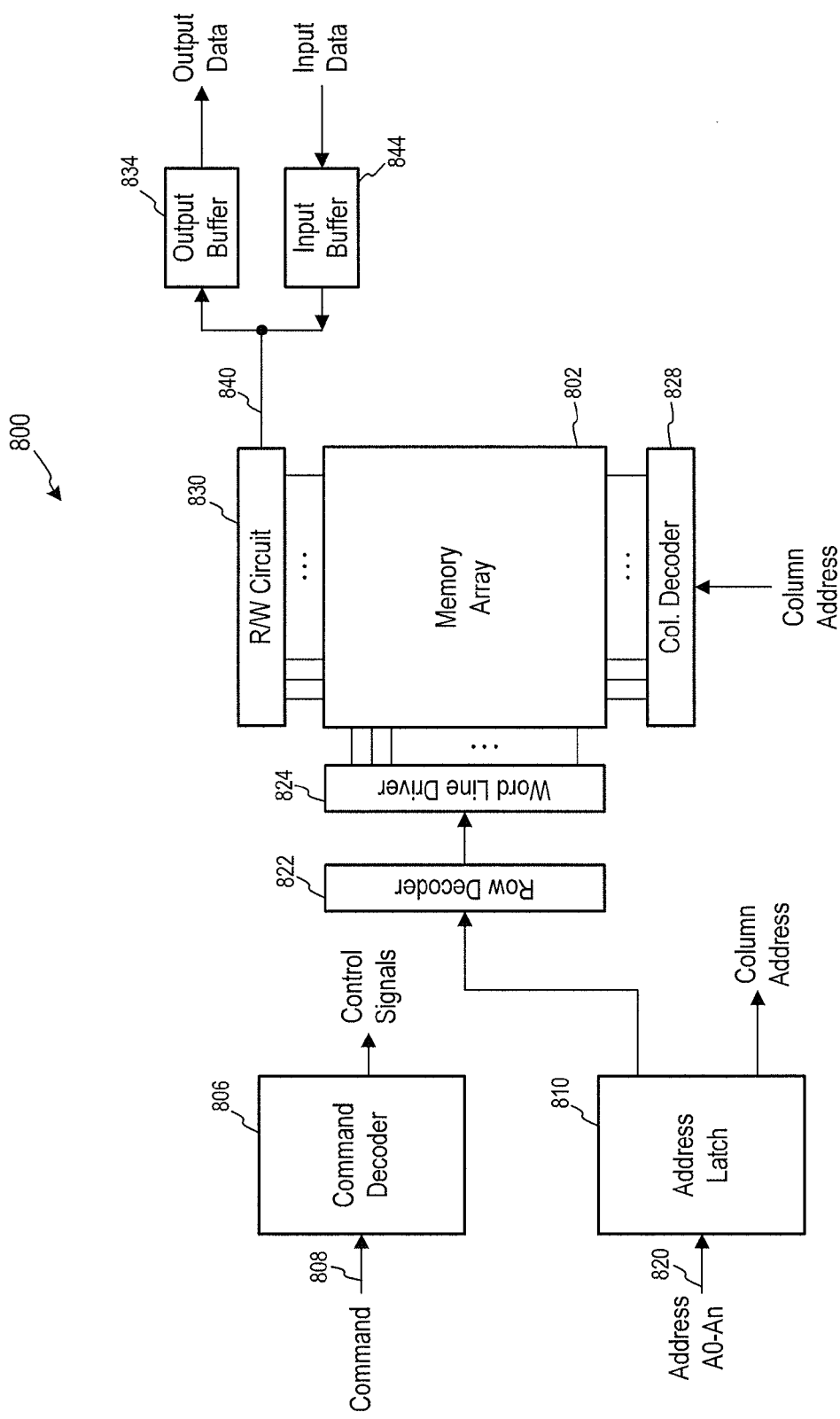
FIG. 8 is a schematic illustration of a portion of a memory 800 according to an embodiment of the present invention.

FIG. 8 is a schematic illustration of a portion of a memory 800 according to an embodiment of the present invention. The memory 800 includes an array 802 of memory cells, which may be, for example, DRAM memory cells, SRAM memory cells, or some other type of memory cells. The memory 800 may include vertical access devices, such as the device shown and described above with reference to FIG. 1. The memory system 800 includes a command decoder 806 that may receive memory commands through a command bus 808 and generate corresponding control signals within the memory system 800 to carry out various memory operations, such as a precharge operation as described herein. Some or all of the circuits described with reference to FIGS. 4-6 may be included in the command decoder 806 in some examples. For example, the command decoder 806 may be used to generate internal control signals to read data from and write data to the memory array 802. The command decoder 806 may further be used to generate internal control signals including, e.g. EQ_ONdly, EQtoGND, and EQtoDVC2 as described herein. Row and column address signals may be applied to the memory system 800 through an address bus 820 and provided to an address latch 810. The address latch may then output a separate column address and a separate row address.

The row and column addresses may be provided by the address latch 810 to a row address decoder 822 and a column address decoder 828, respectively. The column address decoder 828 may select digit lines extending through the array 802 corresponding to respective column addresses. The precharge circuit of FIG. 4 may be included in or coupled to the column decoder in some examples. The row address decoder 822 may be connected to word line driver 824 that may activate respective rows of memory cells in the array 802 corresponding to received row addresses. The selected data line (e.g., a digit line or digit lines) corresponding to a received column address may be coupled to read/write circuitry 830 to provide read data to a data output buffer 834 via an input-output data bus 840. Write data may be applied to the memory array 802 through a data input buffer 844 and the memory array read/write circuitry 830.

The memory shown in FIG. 8 may be implemented in any of a variety of products employing processors and memory including for example cameras, phones, wireless devices, displays, chip sets, set top boxes, gaming systems, vehicles, and appliances. Resulting devices employing the memory system may benefit from the embodiments of a precharge operation described herein to perform their ultimate user function.

From the foregoing it will be appreciated that, although specific embodiments of the invention have been described herein for purposes of illustration, various modifications may be made without deviating from the spirit and scope of the invention.

What is claimed is:

1. Circuitry for use in performing a precharge operation, the circuitry comprising:
    a precharge circuit configured to drive a digit line to a reference responsive, at least in part, to a delayed precharge command;
    a supply driver circuit configured to receive a precharge command and, responsive at least in part to the precharge command, to provide the reference, wherein the reference has a first value during a first period of time during the precharge operation and a second value during a second period of time during the precharge operation, wherein the first value is ground and the second value is between two supply voltages; and
    a precharge control signal circuit including a plurality of delay elements coupled in series, wherein the precharge control signal circuit is configured to receive the precharge command and provide the delayed precharge command.

2. The circuitry of claim 1, wherein the supply driver circuit is further configured to provide the reference having the first value responsive to a first control signal and to provide the reference having the second value responsive to the second control signal.

3. The circuitry of claim 2, wherein the precharge control signal circuit is further configured to provide the first and second control signals, wherein the control signal circuit further comprises an adjustable delay element, and wherein the first period of time is based, at least in part on a delay provided by the adjustable delay element.

4. The circuitry of claim 3, wherein the supply driver circuit comprises an AND gate configured to receive the precharge command and the first control signal, and wherein the supply driver circuit further comprises a transistor having a gate coupled to an output of the AND gate and configured to couple the reference to the first value responsive to the output of the AND gate.

5. The circuitry of claim 3, wherein the supply driver circuit comprises an AND gate configured to receive the precharge command and the second control signal, and wherein the supply driver circuit further comprises a transistor having a gate coupled to an output of the AND gate and configured to couple the reference to the second value responsive, at least in part, to the output of the AND gate.

6. The circuitry of claim 3, wherein the precharge control signal circuit comprises a NOR gate configured to receive a delayed precharge command at a first input and a further delayed precharge command at a second input, and wherein the first control signal is provided at an output of the NOR gate.

7. The circuitry of claim 6, wherein the precharge control signal circuit further comprises an AND gate configured to receive the further delayed precharge command at a first input and the precharge command at a second input, and wherein the second control signal is provided at an output of the AND gate.

8. A memory comprising:
    a digit line;
    a plurality of vertical access devices coupled to the digit line; and
    circuitry coupled to the digit line and configured to precharge the digit line to a reference during a precharge operation, wherein the reference has a first value during a first period of time of the precharge operation and a second value during a second period of time of the precharge operation, and wherein the first value is ground.

9. The memory of claim 8, wherein during at least a portion of the first period of time, accumulated charge in at least one of the vertical access devices is discharged through the digit line.

10. The memory of claim 8, wherein the second value is between two supply voltages.

11. The memory of claim 8, wherein the digit line comprises doped silicon.

12. The memory of claim 8, wherein the circuitry includes an adjustable delay element and the first period of time is based, at least in part, on a delay provided by the adjustable delay element.

13. The memory of claim 8, further comprising another digit line, wherein the circuitry is further configured to precharge the another digit line to the reference having the first value during the first period of time and the second value during the second period of time.

14. A method comprising:
    driving complementary digit lines to ground during a precharge operation; and
    after driving the complementary digit lines to ground during the precharge operation, driving the complementary digit lines to a second value between two supply voltages during the precharge operation.

15. The method of claim 14, wherein said driving complementary digit lines to ground includes discharging accumulated charge from a vertical access device coupled to at least one of the complementary digit lines.

16. The method of claim 14, wherein said driving complementary digit lines to ground comprises driving the complementary digit lines to ground for a period of time based, at least in part, on a delay provided by an adjustable delay element.

17. The method of claim 14, wherein said driving complementary digit lines to ground comprises providing a first control signal responsive to receipt of a precharge command, and wherein said driving the complementary digit lines to the second value comprises providing a second control signal.

18. The method of claim 14, wherein said driving complementary digit lines to ground comprising providing a reference equal to ground by coupling a reference to ground.

19. The method of claim 18, wherein said driving the complementary digit lines to a second value comprises coupling the reference to the second value.

\* \* \* \* \*